US007325216B2

(12) United States Patent
Guo (10) Patent No.: US 7,325,216 B2
(45) Date of Patent: Jan. 29, 2008

(54) METHOD AND COMPUTER PROGRAM FOR SPREADING TRACE SEGMENTS IN AN INTEGRATED CIRCUIT PACKAGE DESIGN

(75) Inventor: Chengyu Guo, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 245 days.

(21) Appl. No.: 11/271,991

(22) Filed: Nov. 9, 2005

(65) Prior Publication Data

US 2007/0104029 A1    May 10, 2007

(51) Int. Cl.
*G06F 17/50* (2006.01)
(52) U.S. Cl. .......................................... 716/12; 716/15
(58) Field of Classification Search ............. 716/12–15
See application file for complete search history.

(56) References Cited

U.S. PATENT DOCUMENTS 6,349,403 B1 * 2/2002 Dutta et al. .................... 716/12
6,665,852 B2 * 12/2003 Xing et al. .................... 716/12
7,139,992 B2 * 11/2006 Xing et al. .................... 716/12

* cited by examiner

Primary Examiner—Jack Chiang
Assistant Examiner—Binh Tat
(74) Attorney, Agent, or Firm—Eric James Whitesell (57) ABSTRACT

A method of routing an integrated circuit package includes receiving as input a placement and routing of at least a portion of an integrated circuit package design, selecting a set of at least three trace segments from the placement and routing that includes at least one inner trace segment routed between two outer trace segments, calculating an inner line function for the inner trace segment that is equally spaced from one of an adjacent line function, an adjacent outer line function, and an adjacent outer trace segment on each side of the inner line function, calculating a pair of end points for the inner line function, and generating as output a new routing that reroutes the inner trace segment collinearly with the inner line function and terminates the inner trace segment by the pair of end points.

14 Claims, 10 Drawing Sheets

METHOD AND COMPUTER PROGRAM FOR SPREADING TRACE SEGMENTS IN AN INTEGRATED CIRCUIT PACKAGE DESIGN

BACKGROUND OF THE INVENTION

1. Field of the Invention

The present invention is directed to the design and manufacture of integrated circuits. More specifically, but without limitation thereto, the present invention is directed to a method of placement and routing of an integrated circuit package design.

2. Description of Related Art

In advanced integrated circuit package designs, sufficient spacing between wire trace interconnects is not only required to meet minimum spacing design rules for manufacturing, but also to avoid capacitively coupled crosstalk that may interfere with proper operation of the manufactured integrated circuit. Previous routing algorithms typically apply minimum spacing design rules for routing nets in each block of the integrated circuit package design.

SUMMARY OF THE INVENTION

A method of spreading trace segments in an integrated circuit package design includes steps of:
(a) receiving as input a placement and routing of at least a portion of an integrated circuit package design;
(b) selecting a set of at least three trace segments from the placement and routing that includes at least one inner trace segment routed between two outer trace segments;
(c) calculating an inner line function for the inner trace segment that is equally spaced from one of an adjacent line function, an adjacent outer line function, and an adjacent outer trace segment on each side of the inner line function;
(d) calculating a pair of end points for the inner line function; and
(e) generating as output a new routing that reroutes the inner trace segment collinearly with the inner line function and terminates the inner trace segment by the pair of end points.

In another embodiment, a computer program product includes:
a medium for embodying a computer program for input to a computer; and
a computer program embodied in the medium for causing the computer to perform steps of:
(a) receiving as input a placement and routing of at least a portion of an integrated circuit package design;
(b) selecting a set of at least three trace segments from the placement and routing that includes at least one inner trace segment routed between two outer trace segments;
(c) calculating an inner line function for the inner trace segment that is equally spaced from one of an adjacent line function, an adjacent outer line function, and an adjacent outer trace segment on each side of the inner line function;
(d) calculating a pair of end points for the inner line function; and
(e) generating as output a new routing that reroutes the inner trace segment collinearly with the inner line function and terminates the inner trace segment by the pair of end points.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Figure 1:
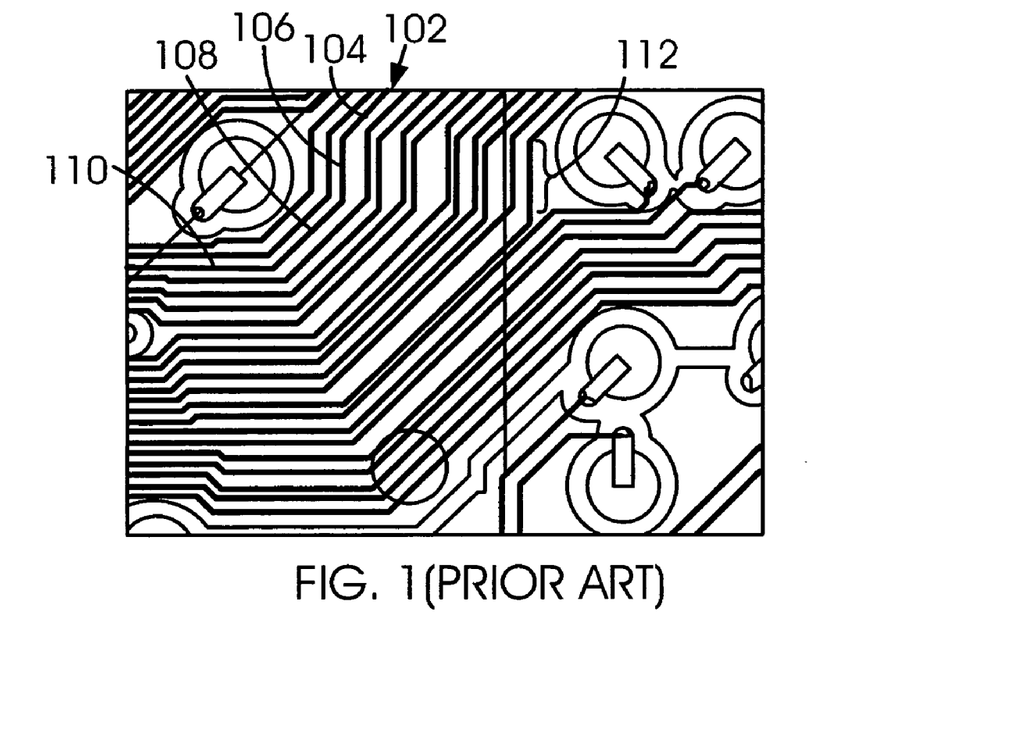
FIG. 1 illustrates a typical placement and routing diagram for a portion of an integrated circuit package design of the prior art.

FIG. 1 illustrates a typical placement and routing diagram 100 for a portion of an integrated circuit package design of the prior art. Shown in FIG. 1 are a trace 102, trace segments 104, 106, 108 and 110, and a set of selected trace segments 112.

In FIG. 1, the trace 1021 typically provides an electrical connection between two points in the placement and routing diagram 100. For example, the trace 102 may be an input/output (I/O) trace that connects a solder bump or finger to a solder ball in an integrated circuit package. An integrated circuit package may have thousands or more traces similar to the trace 102. Because each trace typically changes angle or direction several times, each trace includes at least one trace segment exemplified by the trace segments 104, 106, 108 and 110. Each of the trace segments 104, 106, 108 and 110 is a portion of the trace 102 that extends a given length at a constant angle. Depending on the integrated circuit package design, the angle may have one of a defined set of values, for example, 0, 45, or 90 degrees. In some integrated circuit package designs, the angle may have any value between 0 and 360 degrees.

Typical routing algorithms used in integrated circuit package design software apply minimum spacing design rules for routing each trace segment that do not take into account the spacing of other trace segments that are routed nearby. As a result, some trace segments are routed with closer spacing than others, for example, the set of selected trace segments 112. Due to design requirements for signal-to-noise ratio, design engineers frequently have to spread trace segments in critical routing areas to avoid crosstalk interference that may result in a malfunction of the integrated circuit. In previous routing methods, design engineers visually estimate trace spacing in critical areas and manually spread the trace segments so that they are equally spaced to minimize overall crosstalk between adjacent trace segments. Because the manual spreading procedure is labor intensive and prone to human error, automatically spreading trace segments in the placement and routing portion of the integrated circuit package design may significantly reduce the cost and improve the reliability of integrated circuit package design.

In one embodiment, a method of spreading trace segments in an integrated circuit package design includes steps of:

(a) receiving as input a placement and routing of at least a portion of an integrated circuit package design;

(b) selecting a set of at least three trace segments from the placement and routing that includes at least one inner trace segment routed between two outer trace segments;

(c) calculating an inner line function for the inner trace segment that is equally spaced from one of an adjacent line function, an adjacent outer line function, and an adjacent outer trace segment on each side of the inner line function;

(d) calculating a pair of end points for the inner line function; and (e) generating as output a new routing that reroutes the inner trace segment collinearly with the inner line function and terminates the inner trace segment by the pair of end points.

Figure 2:
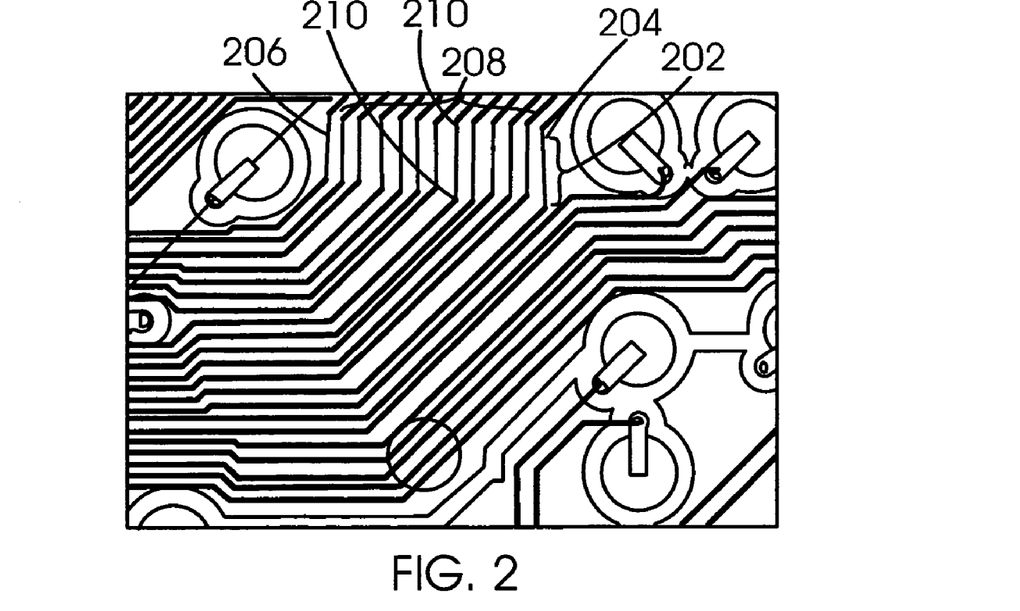
FIG. 2 illustrates a new routing diagram after spreading a first set of trace segments in FIG. 1.

FIG. 2 illustrates a new routing diagram 200 after spreading the set of selected trace segments in FIG. 1. Shown in FIG. 2 are a set of rerouted trace segments 202, outer trace segments 204 and 206, inner trace segments 208, and end points 210.

In FIG. 2, the set of selected trace segments 112 in FIG. 1 has been rerouted so that each of the inner trace segments 208 is equally spaced between the outer trace segments 204 and 206. Also, the end points 210 of the rerouted inner trace segments 208 have been changed to terminate each of the rerouted inner trace segments 208 at the intersection between the inner trace segments 208 and the trace segments that are connected to each end of the inner trace segments 208. As a result of modifying the end points 210, the length of each of the inner trace segments 208 may be lengthened or shortened, and all of the inner trace segments 208 are equally spaced between the outer trace segments 204 and 206. The equal spacing of the inner trace segments 208 between the outer trace segments 204 and 206 advantageously minimizes the capacitive coupling among the set of rerouted trace segments 202. As a result, the signal-to-noise ratio of the set of trace segments 202 is significantly improved over the arrangement of FIG. 1.

The spreading of the set of selected trace segments illustrated in FIG. 2 may be continued as follows.

Figure 3:
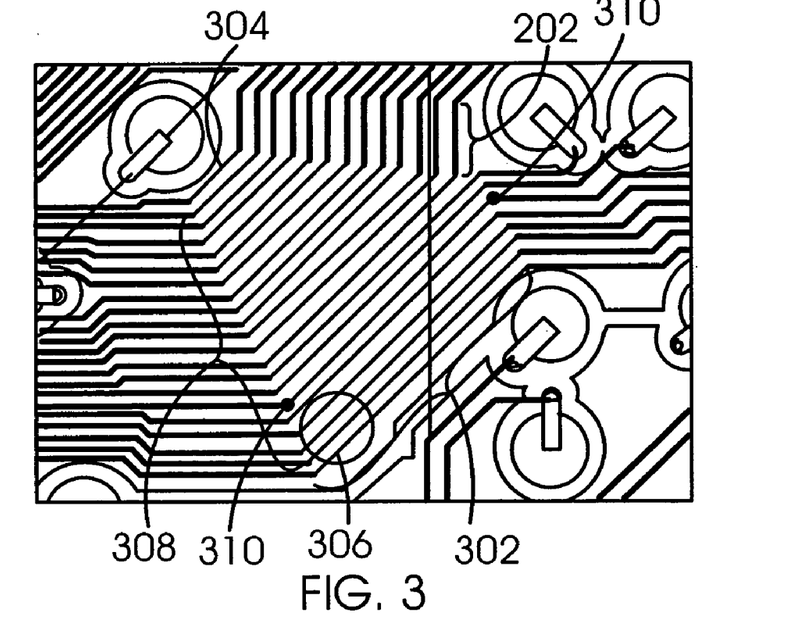
FIG. 3 illustrates a new routing diagram after spreading a second set of trace segments connected to one end of the first set of trace segments in FIG. 2.

FIG. 3 illustrates a new routing diagram 300 after spreading a second set of trace segments connected to one end of the first set of trace segments in FIG. 2. Shown in FIG. 3 are a first set of rerouted trace segments 202, a second set of rerouted trace segments 302, outer trace segments 304 and 306, inner trace segments 308, and end points 310.

In FIG. 3, the second set of rerouted trace segments 302 has been rerouted in the same manner described above for the first set of rerouted trace segments 202 in FIG. 2.

Figure 4:
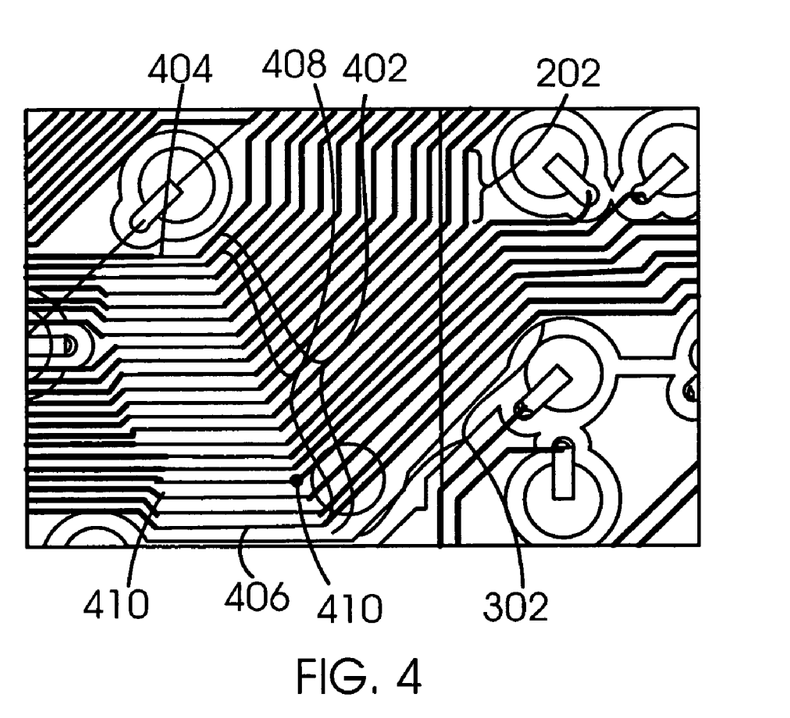
FIG. 4 illustrates a new routing diagram after spreading a third set of trace segments connected to one end of the second set of trace segments in FIG. 3.

FIG. 4 illustrates a new routing diagram 400 after spreading a third set of trace segments connected to one end of the second set of trace segments in FIG. 3. Shown in FIG. 4 are a first set of rerouted trace segments 202, a second set of rerouted trace segments 302, a third set of rerouted trace segments 402, outer trace segments 404 and 406, inner trace segments 408, and end points 410.

In FIG. 4, the third set of rerouted trace segments 402 has been rerouted in the same manner described above for the first set of trace segments 202 in FIG. 2.

Figure 5:
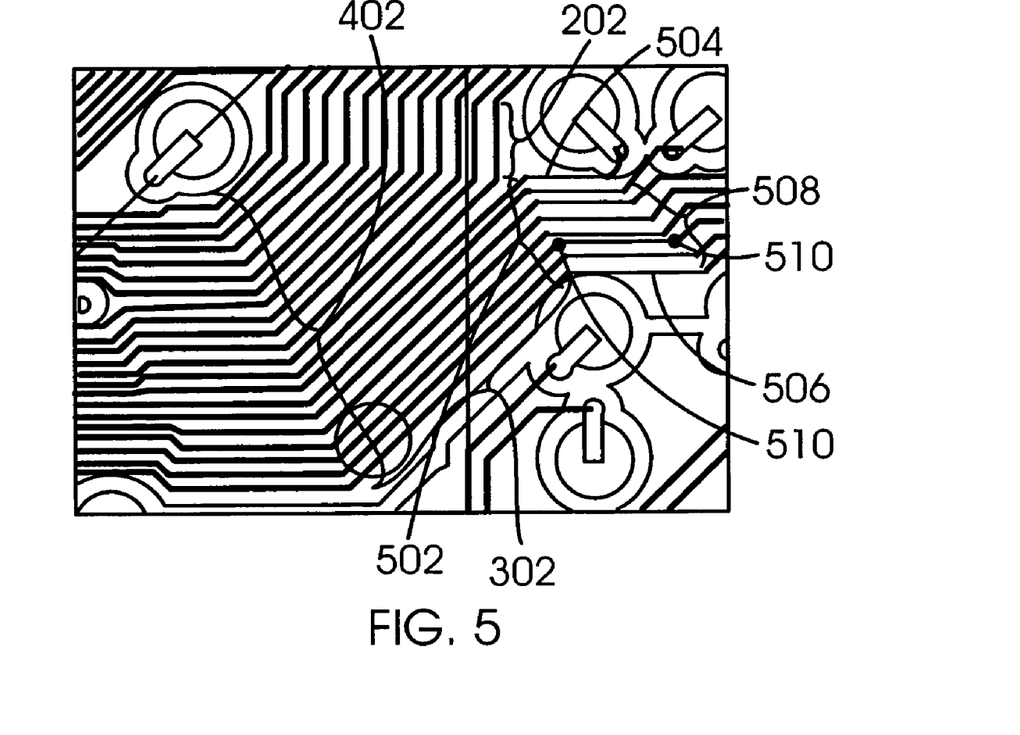
FIG. 5 illustrates a new routing diagram after spreading a fourth set of trace segments connected to the other end of the second set of trace segments in FIG. 4.

FIG. 5 illustrates a new routing diagram 500 after spreading a fourth set of trace segments connected to the other end of the second set of trace segments in FIG. 4. Shown in FIG. 5 are a first set of rerouted trace segments 202, a second set of rerouted trace segments 302, a third set of rerouted trace segments 402, a fourth set of rerouted trace segments 502, outer trace segments 504 and 506, inner trace segments 508, and end points 510.

In FIG. 5, the fourth set of rerouted trace segments 502 has been rerouted in the same manner described above for the first set of trace segments 202 in FIG. 2.

Figure 6:
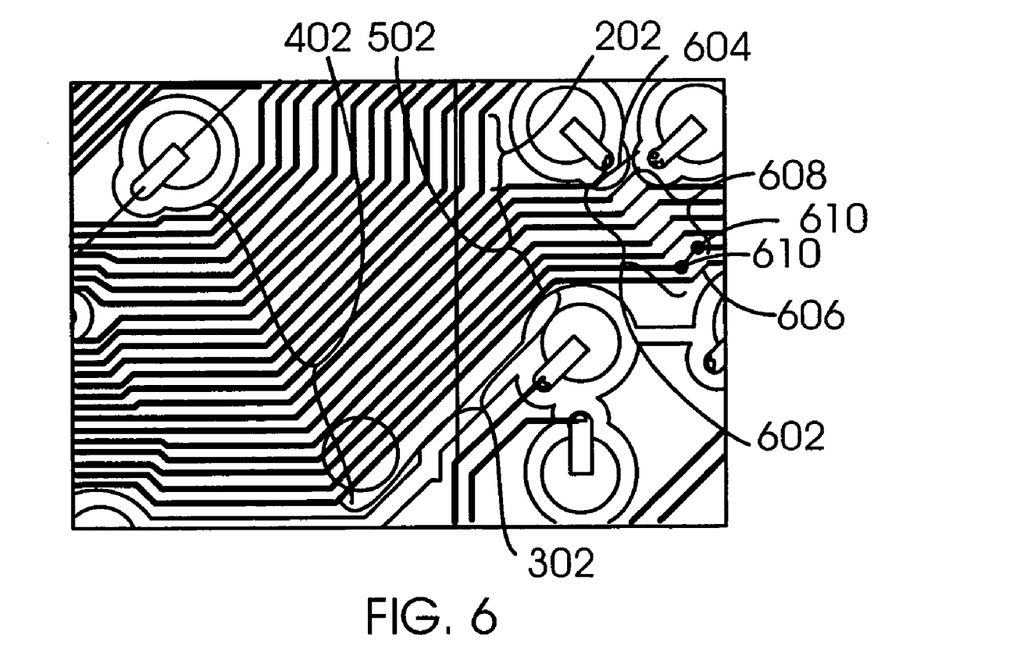
FIG. 6 illustrates a new routing diagram after spreading a fifth set of trace segments connected to one end of the fourth set of trace segments in FIG. 5.

FIG. 6 illustrates a new routing diagram 600 after spreading a fifth set of trace segments connected to one end of the fourth set of trace segments in FIG. 5. Shown in FIG. 5 are a first set of rerouted trace segments 202, a second set of rerouted trace segments 302, a third set of rerouted trace segments 402, a fourth set of rerouted trace segments 502, a fifth set of rerouted trace segments 602, outer trace segments 604 and 606, inner trace segments 608, and end points 610.

In FIG. 6, the fifth set of rerouted trace segments 602 has been rerouted in the same manner described above for the first set of rerouted trace segments 202 in FIG. 2.

An integrated circuit package designer or other user may select each set of trace segments to be spread in FIGS. 2-6 by a window, by a temp group, or directly by clicking on each segment with a pointing device according to well-known computer automated design (CAD) techniques.

Figure 7:
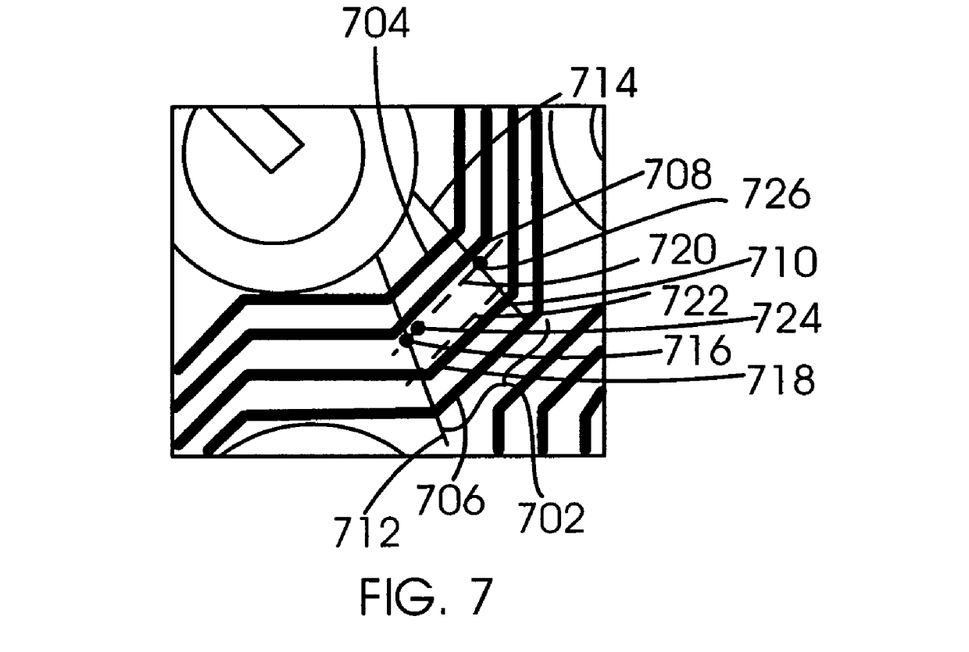
FIG. 7 illustrates the routing diagram of FIG. 1 in which a set of trace segments is selected using boundary lines inside the set of selected trace segments.

FIG. 7 illustrates a magnified view 700 of the routing diagram of FIG. 1 in which a set of trace segments is selected using boundary lines inside the outer trace segments. Shown in FIG. 7 are a set of selected trace segments 702, outer trace segments 704 and 706, inner trace segments 708 and 710, boundary lines 712 and 714, a number of equally distant points 716 and 718, inner line functions 720 and 722, and end points 724 and 726.

In FIG. 7, the boundary lines 712 and 714 are received as input by an integrated circuit package designer or user according to well known computer automated design (CAD) techniques, for example, by clicking on one end point of the boundary line 712 or 714, dragging a line from the end point, and clicking on the opposite end point with a manually operated pointing device such as a computer mouse. In this example, the boundary line 712 is drawn approximately through one end of each of the outer trace segments 704 and 706, and the boundary line 714 is drawn inside the opposite end of each of outer trace segments 704 and 706.

The boundary line 712 is divided into the equally distant points 716 and 718 from the outer trace segments 704 and 706. In general, the number of equally distant points is equal to the number of inner line segments. The inner line functions 720 and 722 are generated so that they pass through each of the equally distant points 716 and 718 respectively and have the same slope as each of the outer trace segments 704 and 706.

The end point 724 is calculated for the inner line function 720 at the intersection of the inner line function 720 and the trace segment connected to one end of the inner trace segment 708. The end point 726 is calculated for the inner line function 720 at the intersection of the inner line function 720 and the trace segment connected to the opposite end of the inner trace segment 708. In the same manner, a pair of end points is generated for the inner line function 722.

Figure 8:
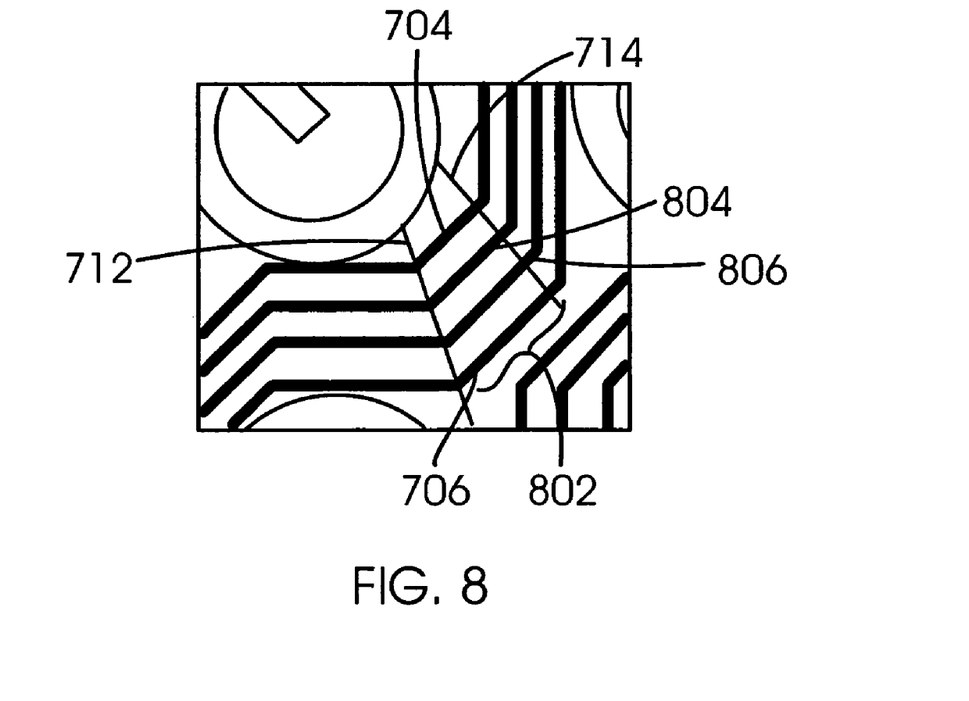
FIG. 8 illustrates a new routing diagram after spreading the set of trace segments selected in FIG. 7.

FIG. 8 illustrates a new routing diagram 800 after spreading the set of trace segments selected in FIG. 7. Shown in FIG. 8 are a set of rerouted trace segments 802, outer trace segments 704 and 706, boundary lines 712 and 714, and inner trace segments 804 and 806.

In FIG. 8, the inner trace segments 804 and 806 are routed collinearly with the inner line functions 720 and 722 in FIG. 7, rerouting the inner trace segments 708 and 710. The inner trace segments 802 and 804 are equally spaced along the boundary lines 712 and 714 from the outer trace segments 704 and 706, advantageously minimizing the capacitive coupling among the set of rerouted trace segments 802.

Figure 9:
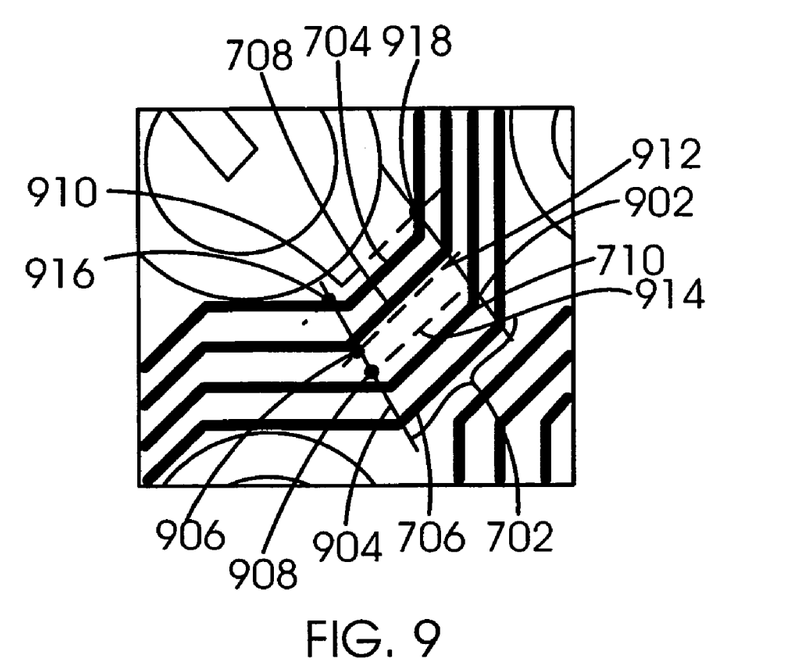
FIG. 9 illustrates a magnified view of the routing diagram of FIG. 1 in which a set of trace segments is selected using boundary lines outside one of the outer trace segments.

FIG. 9 illustrates a magnified view 900 of the routing diagram of FIG. 1 in which a set of trace segments is selected using boundary lines outside one of the outer trace segments. Shown in FIG. 9 are a set of selected trace segments 702, outer trace segments 704 and 706, inner trace segments 708 and 710, boundary lines 902 and 904, a number of equally distant points 906 and 908, an outer line function 910, inner line functions 912 and 914, and end points 916 and 918.

In FIG. 9, the boundary lines 902 and 904 may be made, for example, in the same manner described above with reference to FIG. 7. In this example, the boundary lines 902 and 904 are drawn outside the end points of the outer trace segment 704 and through the end points of the outer trace segment 706.

The outer line function 910 passes through the point where the trace segment connected to one end of the trace segment 704 intersects the boundary line 902. The intersection becomes the end point 916 of the outer line function 910, while the other end point 918 is the intersection of the trace segment connected to the other end of the outer trace segment 704 and the outer line function 910. The outer line function 910 may then be calculated from the end points 916 and 918. In this example, the outer line function 910 is parallel to the outer trace segment 704.

After generating the outer line function 910, the boundary line 902 is divided into the equally distant points 906 and 908 from the outer line function 910 and the outer trace segment 706. The inner line functions 912 and 914 are generated so that they pass through each of the equally distant points 906 and 908 respectively and have the same slope as each of the outer line function 910 and the outer trace segment 706.

After generating the inner line functions 912 and 914, a pair of end points for each of the inner line functions 912 and 914 is calculated in the same manner as described above with reference to FIG. 7.

Figure 10:
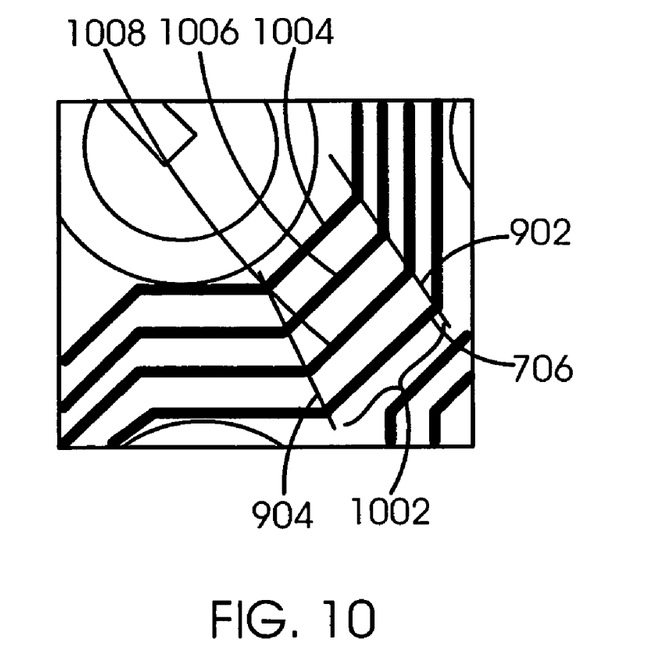
FIG. 10 illustrates a new routing diagram after spreading the set of trace segments selected in FIG. 9.

FIG. 10 illustrates a new routing diagram 1000 after spreading the set of trace segments selected in FIG. 9. Shown in FIG. 10 are a set of rerouted trace segments 1002, outer trace segments 1004 and 706, boundary lines 902 and 904, and inner trace segments 1006 and 1008.

In FIG. 10, the outer trace segment 1004 is routed collinearly with the outer line function 910, and the inner trace segments 1006 and 1008 are routed collinearly with the inner line functions 912 and 914 in FIG. 9, rerouting the inner trace segments 708 and 710. The inner trace segments 1006 and 1008 are equally spaced along the boundary lines 902 and 904 from the outer trace segments 1004 and 706, advantageously minimizing the capacitive coupling among the set of rerouted trace segments 1002.

Figure 11:
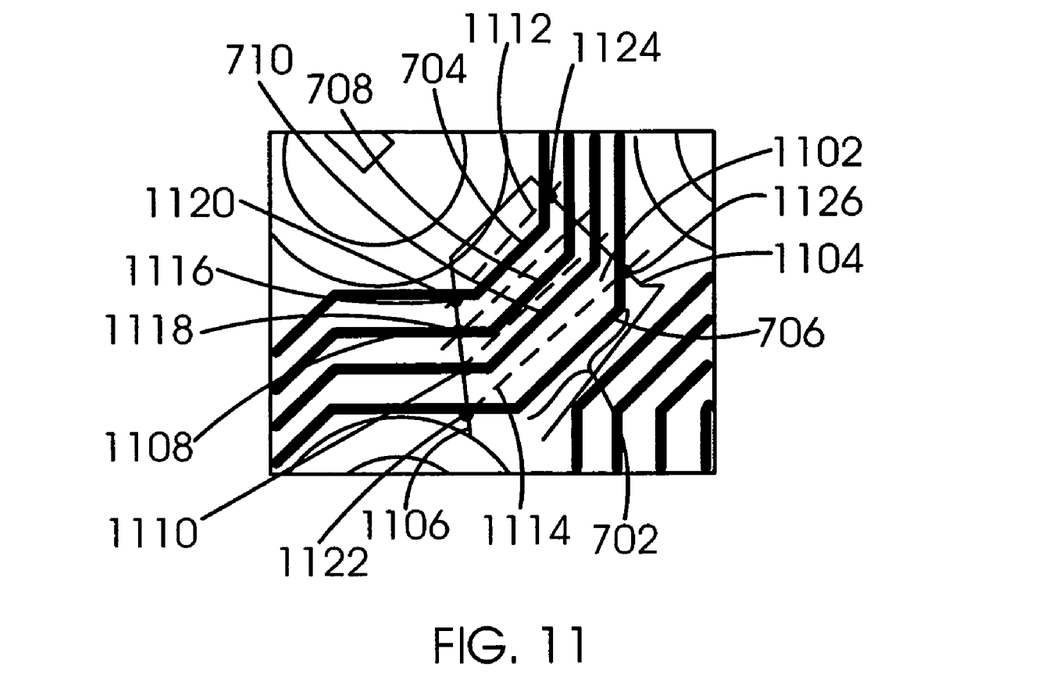
FIG. 11 illustrates the routing diagram of FIG. 1 in which a set of trace segments is selected using boundary lines connected to define a spreading region for the set of selected trace segments.

FIG. 11 illustrates a magnified view 1100 of the routing diagram of FIG. 1 in which a set of trace segments is selected by defining a spreading region for the set of selected trace segments. Shown in FIG. 11 are a set of selected trace segments 702, outer trace segments 704 and 706, inner trace segments 708 and 710, a spreading region 1102, boundary lines 1104 and 1106, a number of equally distant points 1108 and 1110, outer line functions 1112 and 1114, inner line functions 1116 and 1118, and end points 1120, 1122, 1124, and 1126.

In FIG. 11, the spreading region 1102 may be received as input, for example, in the same manner as the boundary lines 712 and 714 described above with reference to FIG. 7, except that the boundary lines 1104 and 1106 are connected to form a polygon that encloses the spreading region 1102. In this example, the spreading region 1102 is drawn so that the boundary lines 1104 and 1106 lie outside the end points of both the outer trace segments 704 and 706. Drawing the boundary lines 1104 and 1106 outside the end points of either or both of the outer trace segments 704 and 706 may be used to indicate that one or both of the outer trace segments 704 and 706 are to be rerouted so that their end points lie on one of the boundary lines 1104 and 1106.

The outer line functions 1112 and 1114 are calculated for the corresponding outer trace segments 704 and 706 so that the outer line functions 1112 and 1114 have the same slope as each of the outer trace segments 704 and 706. Each of the outer line functions 1112 and 1114 passes through one of the end points 1120 and 1122 where the trace segment connected to one end of each of the outer trace segments 704 and 706 intersects the boundary line 1104. The other end point 1124 of the outer line function 1112 is the intersection of the trace segment connected to the other end of the outer trace segment 704 and the outer line function 1112, while the other end point 1126 of the outer line function 1114 is the intersection of the trace segment connected to the other end of the outer trace segment 706 and the outer line function 1114.

After generating the outer line functions 1112 and 1114, the boundary line 1106 is divided into the equally distant points 1108 and 1110 from the outer line functions 1112 and 1114. The inner line functions 1116 and 1118 are generated so that they pass through each of the equally distant points 1108 and 1110 respectively and have the same slope as each of the outer line functions 1112 and 1114.

After generating the inner line functions 1116 and 1118, a pair of end points for each of the inner line functions 1116 and 1118 is calculated in the same manner as described above with reference to FIG. 7.

Figure 12:
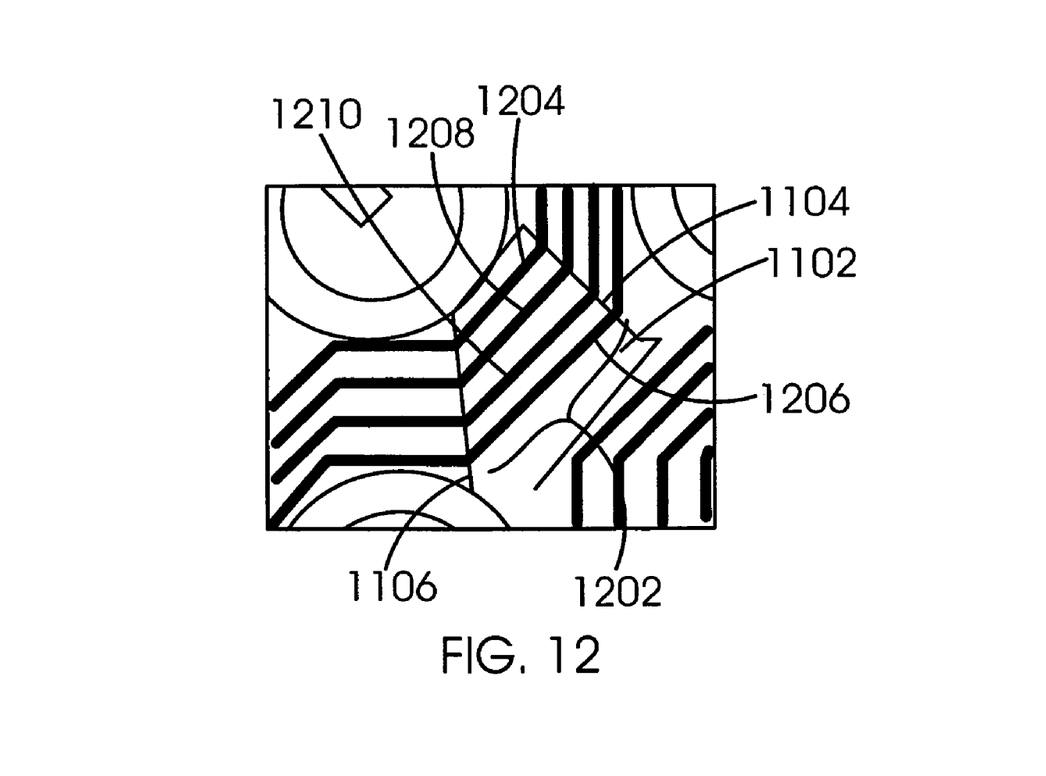
FIG. 12 illustrates a new routing diagram after spreading the set of trace segments selected in FIG. 11.

FIG. 12 illustrates a new routing diagram 1200 after spreading the set of trace segments selected in FIG. 11. Shown in FIG. 12 are a spreading region 1102, a set of rerouted trace segments 1202, outer trace segments 1204 and 1206, and inner trace segments 1208 and 1210.

In FIG. 12, the outer trace segments 1204 and 1206 are routed collinearly with the outer line functions 1112 and 1114 in FIG. 11, and the inner trace segments 1208 and 1210 are routed collinearly with the inner line functions 1116 and 1118 in FIG. 11, rerouting the inner trace segments 708 and 710. The inner trace segments 1208 and 1210 are equally spaced along the boundary line 1106 from the outer trace segments 1204 and 1206, advantageously minimizing the capacitive coupling among the set of rerouted trace segments 1202.

Figure 13:
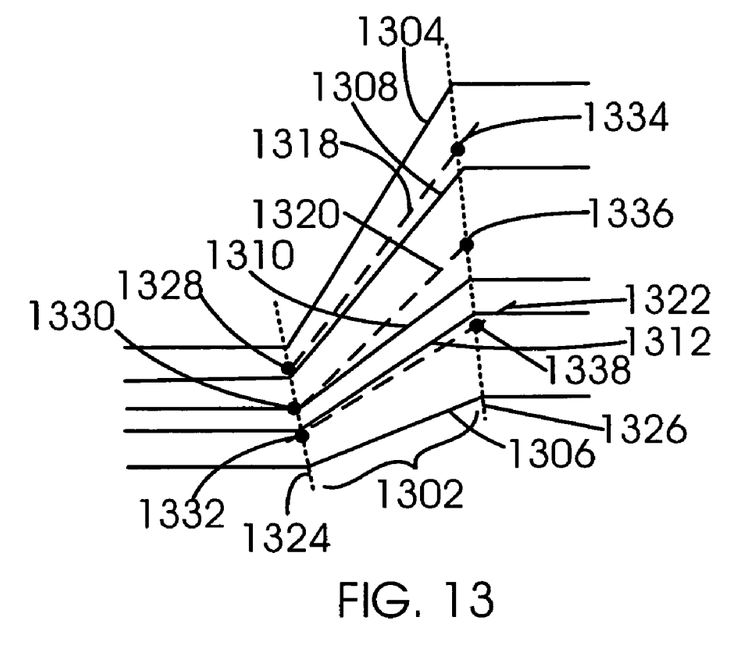
FIG. 13 illustrates a magnified view of a placement and routing diagram for a portion of an integrated circuit package design that includes a set of non-parallel trace segments.

FIG. 13 illustrates a magnified view 1300 of a placement and routing diagram for a portion of an integrated circuit package design that includes a set of non-parallel trace segments. Shown in FIG. 13 are a set of selected trace segments 1302, outer trace segments 1304 and 1306, inner trace segments 1308, 1310, and 1312, inner line functions 1318, 1320, and 1322, boundary lines 1324 and 1326, and equally spaced points 1328, 1330, 1332, 1334, 1336, and 1338.

In FIG. 13, the difference in slope between the outer trace segments 1304 and 1306 is divided into a stepped angle according to the formula $$step(i) = \frac{\text{angle between outer segments}}{N+1} * i \quad (1)$$

where N is the number of inner segments and i is the inner line function index. For example, if the difference in slope between the two outer trace segments 1304 and 1306 is 40 degrees and there are N=3 inner trace segments, then the stepped angle would have a value of (40/4*1)=10 degrees for the first inner line function 1312, and (40/4*2)=20 degrees for the second inner line function 1310, and (40/4*3)=30 degrees for the third inner line function 1308. The stepped angle is added to the slope of the outer trace segment having the lowest slope to generate the slope of each inner line function. For example, if the outer trace segments 1306 and 1304 have slopes of 40 degrees and 80 degrees respectively, then the inner line functions 1322, 1320, and 1318 would have slopes of 50 degrees, 60 degrees, and 70 degrees, respectively. The end points of the outer trace segments 1304 and 1306 and of the inner line functions 1308, 1310, and 1312 may be calculated in the same manner as described above with reference to FIG. 9.

Alternatively, a distance between the outer trace segments 1304 and 1306 may be calculated along the second boundary line 1326 and divided by the same number of equally spaced points as the first boundary line 1324. Each of the inner line functions 1318, 1320, and 1322 is calculated to intersect the first and second boundary lines at a corresponding pair of the equally distant points 1328, 1330, and 1332 along the first boundary line 1314 and the equally distant points 1334, 1336, and 1338 along the second boundary line 1326. The end points of the inner line functions 1318, 1320, and 1322 may be calculated in the same manner as described above with reference to FIG. 9.

Figure 14:
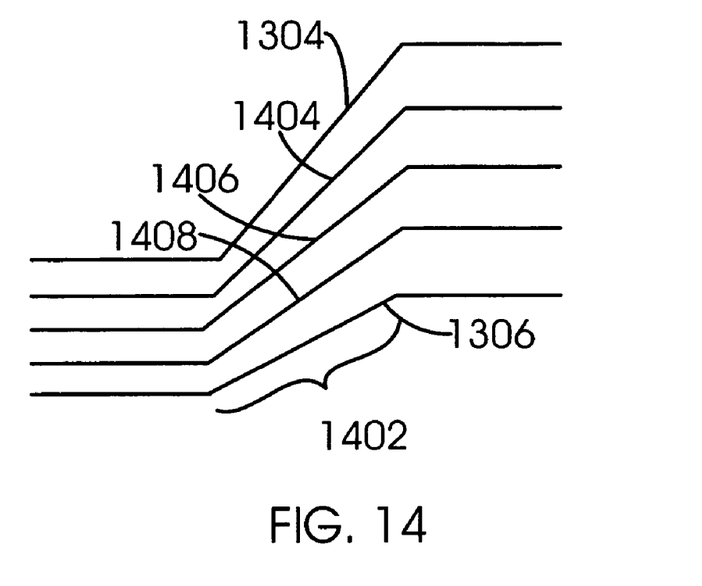
FIG. 14 illustrates a new routing diagram after spreading the set of non-parallel trace segments in FIG. 13.

FIG. 14 illustrates a new routing diagram 1400 after spreading the set of non-parallel trace segments in FIG. 13. Shown in FIG. 14 are a set of rerouted trace segments 1402, outer trace segments 1304 and 1306, and inner trace segments 1404, 1406, and 1408.

In FIG. 14, the inner trace segments 1404, 1406, and 1408 are routed collinearly with the inner line functions 1318, 1320, and 1322 in FIG. 13, rerouting the inner trace segments 1308, 1310, and 1312. The inner trace segments 1404, 1406, and 1408 are equally spaced from the outer trace segments 1304 and 1306, advantageously minimizing the capacitive coupling among the set of rerouted trace segments 1402.

The method of spreading trace segments described in the examples above may be performed by the following steps.

Figures 15, 15B:
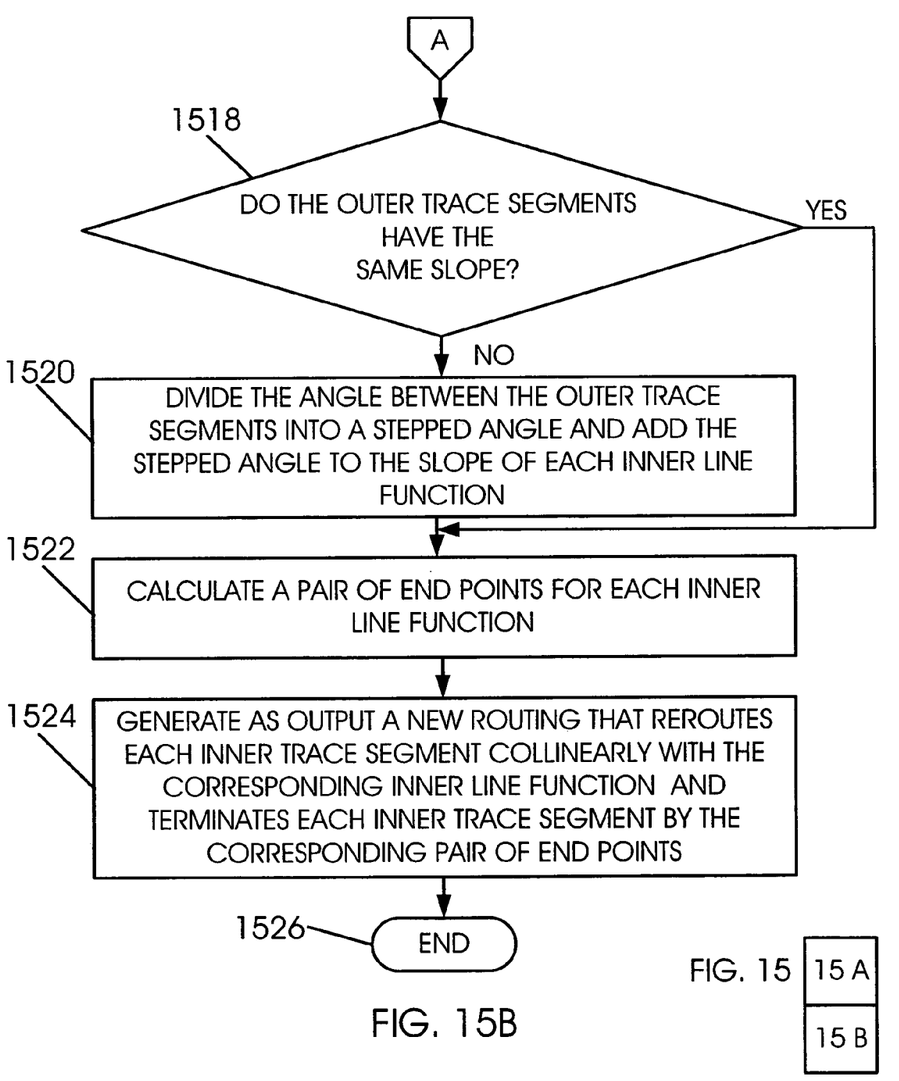
FIG. 15 illustrates a flow chart for a method of spreading a set of trace segments.
Figure 15A:
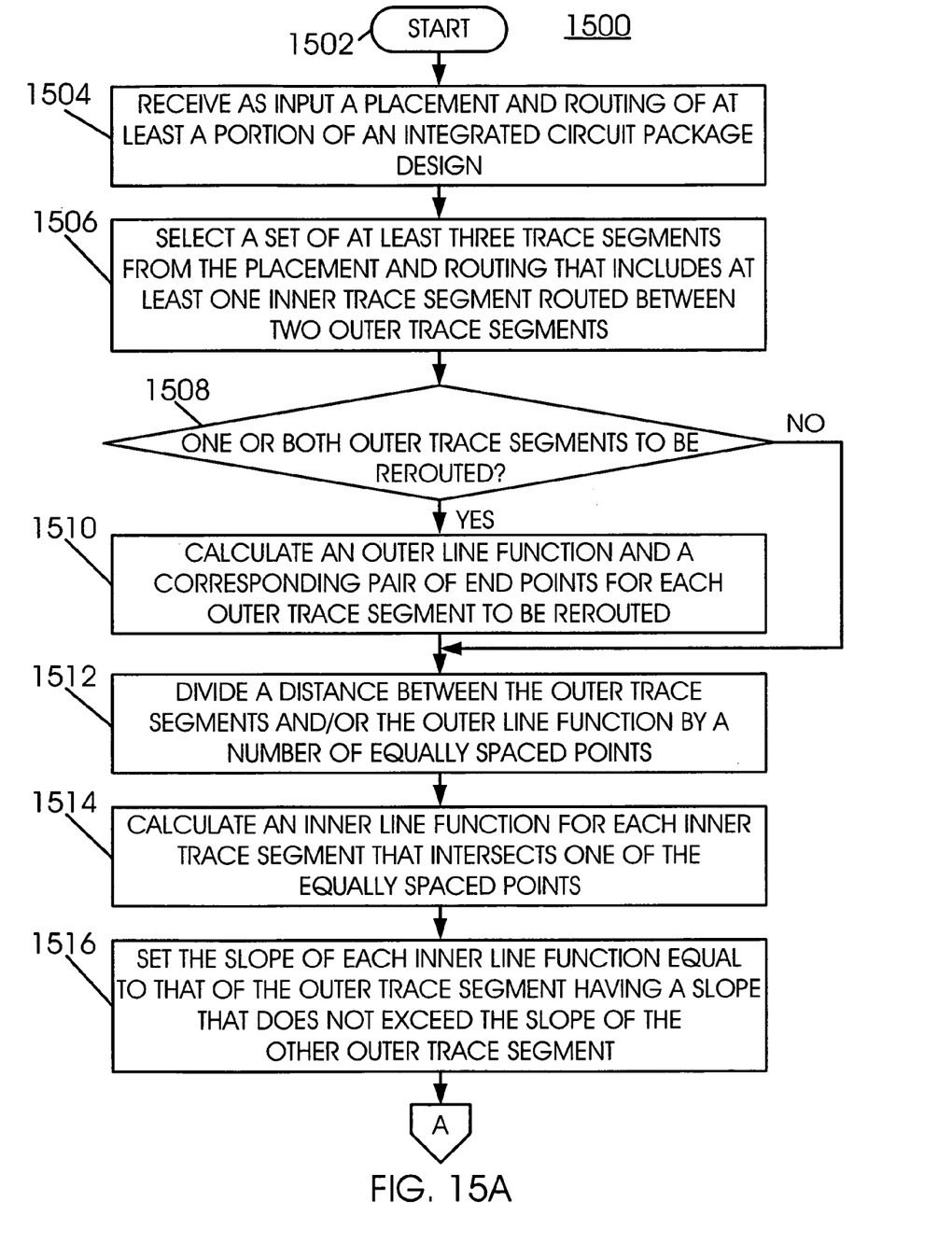

FIG. 15 illustrates a flow chart 1500 for a method of spreading a set of trace segments.

Step 1502 is the entry point of the flow chart 1500.

In step 1504, a placement and routing of at least a portion of an integrated circuit package design is received as input according to well-known techniques. For example, the placement and routing may include only portions of an integrated circuit package design that are noise critical areas. Alternatively, the placement and routing of the entire integrated circuit package design may be received as input for equally spreading all the trace segments if desired.

In step 1506, a set of at least three trace segments is selected from the placement and routing that includes at least one inner trace segment routed between two outer trace segments. For example, the set of trace segments may be selected manually by an integrated circuit package designer or other user, or the set of trace segments may be read from a previously generated list.

In step 1508, if the selection of the set of trace segments indicates that one or both of the outer trace segments are to be rerouted, then the method continues from step 1510. Otherwise, the method continues from step 1512.

In step 1510, an outer line function and a corresponding pair of end points is calculated for each outer trace segment to be rerouted as described above with reference to FIG. 11.

In step 1512, a distance between the outer trace segments and/or the outer line function is divided by a number of equally spaced points.

In step 1514, an inner line function is calculated for each inner trace segment. Each inner line function passes through one of the equally spaced points so that each inner line function is equally spaced from an adjacent inner line function, an adjacent outer line function, or an adjacent outer trace segment on each side of the inner line function.

In step 1516, the slope of each inner line function is set equal to that of the outer trace segment having a slope that does not exceed the slope of the other outer trace segment. In other words, if the slopes of the outer trace segments are equal, then the slope of each inner line function is set equal to that of either outer trace segment. On the other hand, if the slopes of the outer trace segments are not equal, then the slope of each inner line function is set equal to that of the outer trace segment having the lesser slope.

In step 1518, if the outer trace segments have the same slope, then the method continues from step 1522. Otherwise, the method continues from step 1520.

In step 1520, the angle between the outer trace segments is divided into a stepped angle, and the stepped angle is added to the slope for each inner line function as described above with reference to equation (1).

Alternatively, a distance between the outer trace segments may be calculated along a second boundary line between the two outer segments according to well-known techniques and divided by a number of points that are equally spaced from one another and the outer trace segments in the same manner as the first boundary line. Each inner line function is calculated to intersect the first and second boundary lines at a corresponding pair of equally distant points along the first and second boundary lines.

In step 1522, a pair of end points is calculated for each inner line function. Each end point may be found by calculating the intersection point of the inner line function and a trace segment that is connected to one end of the corresponding inner trace segment according to well-known techniques. The trace segment connected to one end of the corresponding inner trace segment may be extended or trimmed as necessary to terminate at the intersection point.

In step 1524, a new routing is generated as output that reroutes each inner trace segment collinearly with the corresponding inner line function and terminates each inner trace segment by the corresponding pair of end points.

Step 1526 is the exit point of the flow chart 1500.

The flow chart described above may also be automated by instructions for a computer. The instructions may be embodied in a disk, a CD-ROM, and other computer readable media according to well known computer programming techniques.

Figure 16:
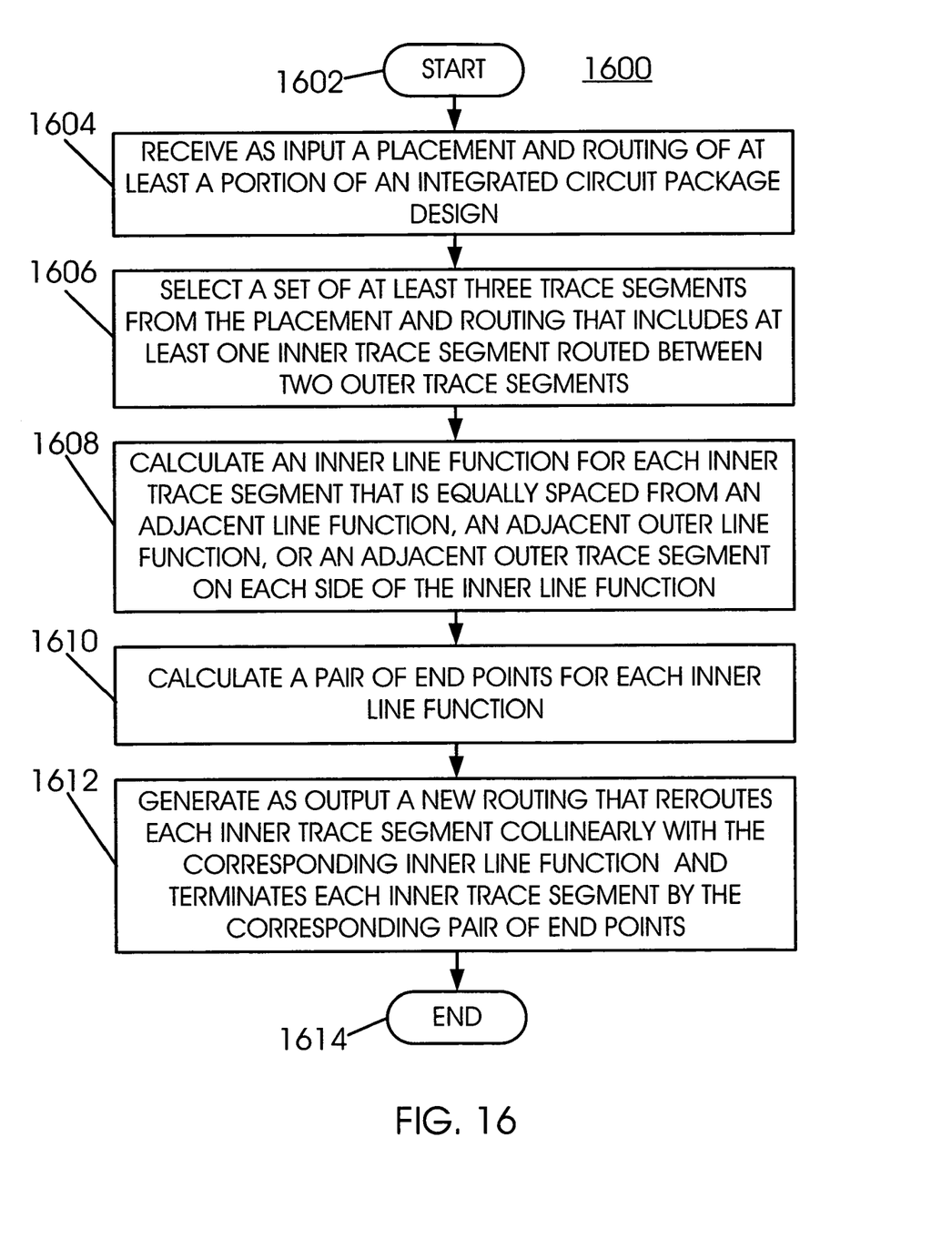
FIG. 16 illustrates a flow chart for a computer program product for spreading trace segments in an integrated circuit package design that summarizes the method of FIG. 15.

FIG. 16 illustrates a flow chart for a computer program product for spreading trace segments in an integrated circuit package design that summarizes the method of FIG. 15.

Step 1602 is the entry point of the flow chart 1600.

In step 1604, a placement and routing of at least a portion of an integrated circuit package design is received as input.

In step 1606, a set of at least three trace segments is selected from the placement and routing that includes at least one inner trace segment routed between two outer trace segments.

In step 1608, an inner line function is calculated for the inner trace segment that is equally spaced from one of an adjacent line function, an adjacent outer line function, and an adjacent outer trace segment on each side of the inner line function.

In step 1610, a pair of end points is calculated for the inner line function. For example, one end point of the pair of end points may be the intersection of the inner line function and one of a plurality of equally spaced points along a boundary line between the outer trace segments and/or an outer line function. The other end point of the pair of end points may be the intersection of the inner line function and a trace segment connected to the inner trace segment.

In step 1612, a new routing is generated as output that reroutes the inner trace segment collinearly with the inner line function and terminates the inner trace segment by the pair of end points.

Step 1614 is the exit point of the flow chart 1600.

In alternative embodiments, the method described above may also be applied to the layout of integrated circuits as well as to integrated circuit package designs within the scope of the appended claims.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method comprising steps of:
   (a) receiving as input a placement and routing of at least a portion of an integrated circuit package design;
   (b) selecting a set of at least three trace segments from the placement and routing, the set including at least one inner trace segment routed between two outer trace segments;
   (c) receiving as input a boundary line for the set of at least three trace segments;
   (d) calculating an inner line function for the inner trace segment that is equally spaced from one of an adjacent line function, an adjacent outer line function, and an adjacent outer trace segment on each side of the inner line function;
   (e) calculating a pair of end points for the inner line function; and
   (f) generating as output a new routing that reroutes the inner trace segment collinearly with the inner line function and terminates the inner trace segment by the pair of end points.

2. The method of claim 1 wherein step (d) comprises setting a slope of the inner line function equal to a slope of one of the two outer trace segments.

3. The method of claim 2 wherein step (d) comprises dividing an angle between the two outer trace segments to calculate a stepped angle and adding the stepped angle to the slope of the inner line function.

4. The method of claim 1 wherein step (e) comprises calculating an intersection of the inner line function and a trace segment connected to one end of the inner trace segment.

5. The method of claim 4 wherein step (d) comprises dividing the boundary line into a number of equally distant points.

6. The method of claim 5 farther comprising calculating an outer line function for at least one of the two outer trace segments wherein an intersection of the outer line function and a trace segment connected to one end of the outer trace segment lies on the boundary line.

7. The method of claim 5 wherein step (d) comprises calculating the inner line function to intersect the boundary line at one of the equally distant points.

8. A computer readable storage medium tangibly embodying instructions for a computer that when executed by the computer implement a method, the method comprising steps of:

(a) receiving as input a placement and routing of at least a portion of an integrated circuit package design;

(b) selecting a set of at least three trace segments from the placement and routing, the set including at least one inner trace segment routed between two outer trace segments;

(c) receiving as input a boundary line for the set of at least three trace segments;

(d) calculating an inner line function for the inner trace segment that is equally spaced from one of an adjacent line function, an adjacent outer line function, and an adjacent outer trace segment on each side of the inner line function;

(e) calculating coordinates of a pair of end points for the inner line function; and (f) generating as output a new routing that reroutes the inner trace segment collinearly with the inner line function and terminates the inner trace segment by the pair of end points.

9. The computer readable storage medium of claim 8 wherein step (d) comprises setting a slope of inner line function equal to a slope of one of the two outer trace segments.

10. The computer readable storage medium of claim 9 wherein step (d) comprises dividing an angle between the two outer trace segments to calculate a stepped angle and adding the stepped angle to the slope of the inner line function.

11. The computer readable storage medium of claim 8 wherein step (e) comprises calculating an intersection of the inner line function and a trace segment connected to one end of the inner trace segment.

12. The computer readable storage medium of claim 11 wherein step (d) comprises dividing the boundary line into a number of equally distant points.

13. The computer readable storage medium of claim 12 further comprising calculating an outer line function for at least one of the two outer trace segments wherein an intersection of the outer line function and a trace segment connected to one end of the outer trace segment lies on the boundary line.

14. The computer readable storage medium of claim 12 wherein step (d) comprises calculating the inner line function to intersect the boundary line at one of the equally distant points.

* * * * *